(12) United States Patent
Kwon et al.

(10) Patent No.: US 9,911,510 B1
(45) Date of Patent: Mar. 6, 2018

(54) REDUNDANCY SCHEMES FOR MEMORY CELL REPAIR

(71) Applicant: ARM Limited, Cambridge (GB)

(72) Inventors: Jungtae Kwon, San Jose, CA (US); Young Suk Kim, San Jose, CA (US); Vivek Nautiyal, Milpitas, CA (US); Pranay Prabhat, Cambridge (GB); Fakhruddin Ali Bohra, Austin, TX (US); Shri Sagar Dwivedi, San Jose, CA (US); Satinderjit Singh, Fremont, CA (US); Lalit Gupta, Cupertino, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/288,832

(22) Filed: Oct. 7, 2016

(51) Int. Cl.
*G11C 29/00* (2006.01)
*G11C 11/418* (2006.01)
*G11C 11/412* (2006.01)

(52) U.S. Cl.
CPC ............ *G11C 29/76* (2013.01); *G11C 11/418* (2013.01); *G11C 11/4125* (2013.01)

(58) Field of Classification Search
CPC ..... G11C 29/00; G11C 29/808; G11C 29/785; G11C 29/81
See application file for complete search history.

(56) References Cited

U.S. PATENT DOCUMENTS

| 6,646,932 B2* | 11/2003 | Kato | G11C 29/808 365/200 |
|---|---|---|---|
| 6,870,782 B2* | 3/2005 | Wu | G11C 29/848 365/189.02 |
| 8,913,450 B2* | 12/2014 | Kim | G11C 16/20 365/189.14 |
| 9,030,897 B2* | 5/2015 | Song | G11C 8/14 365/200 |
| 9,361,953 B2* | 6/2016 | Chi | G11C 7/02 |

\* cited by examiner

*Primary Examiner* — Tri Hoang
(74) *Attorney, Agent, or Firm* — Pramudji Law Group PLLC; Ari Pramudji

(57) ABSTRACT

Various implementations described herein are directed to an integrated circuit having a memory cell array with multiple rows of memory cells including at least one redundant row of memory cells. The memory cell array may be partitioned into multiple regions of memory cells including a first region of memory cells corresponding to a first part of the redundant row of memory cells and a second region of memory cells corresponding to a second part of the redundant row of memory cells. The integrated circuit may include wordline driver circuitry coupled to the first and second regions of memory cells and their corresponding first and second parts of the redundant row of memory cells. In some instances, the integrated circuit may include row shift circuitry coupled to the first and second regions of memory cells and their corresponding first and second parts of the redundant row of memory cells.

20 Claims, 9 Drawing Sheets

REDUNDANCY SCHEMES FOR MEMORY CELL REPAIR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, an integrated circuit (IC) having components of a computing system provided on a single chip typically refers to system on a chip (SoC). The SoC is fabricated to include digital, analog, mixed-signal, and/or radio-frequency (RF) capability on a single chip substrate. SoC applications are useful for mobile electronic devices due to their low power consumption and minimal area impact in embedded systems.

In some applications, an SOC may include embedded memory, such as, e.g., static random access memory (SRAM). Due to a denser layout, SRAM may have a higher defect density than other logic circuits, and to improve yield of SRAM, redundant SRAM cells may be provided. SRAM cells may be arranged in an array pattern, and redundant cells are provided as a column or row in the same array as memory cell instances. For SRAM in an SOC, column redundancy is sufficient; however, if accumulated density of SRAM is large, then row redundancy may be used.

Unfortunately, due to conventional layouts, only one defective or faulty row of SRAM memory cells are repairable with one row of redundant memory cells. As such, in conventional technology, if a memory cell array has multiple defective or faulty memory cells on different rows, then only one of the defective or faulty rows is repairable.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to redundancy schemes for memory applications, including increasing repair efficiency of shift based techniques for row redundancy schemes in semiconductor based memory cell arrays. Thus, various implementations of shift based row redundancy schemes for increased repair efficiency will now be described in detail herein with reference to FIGS. 1A-4.

Figure 1A:
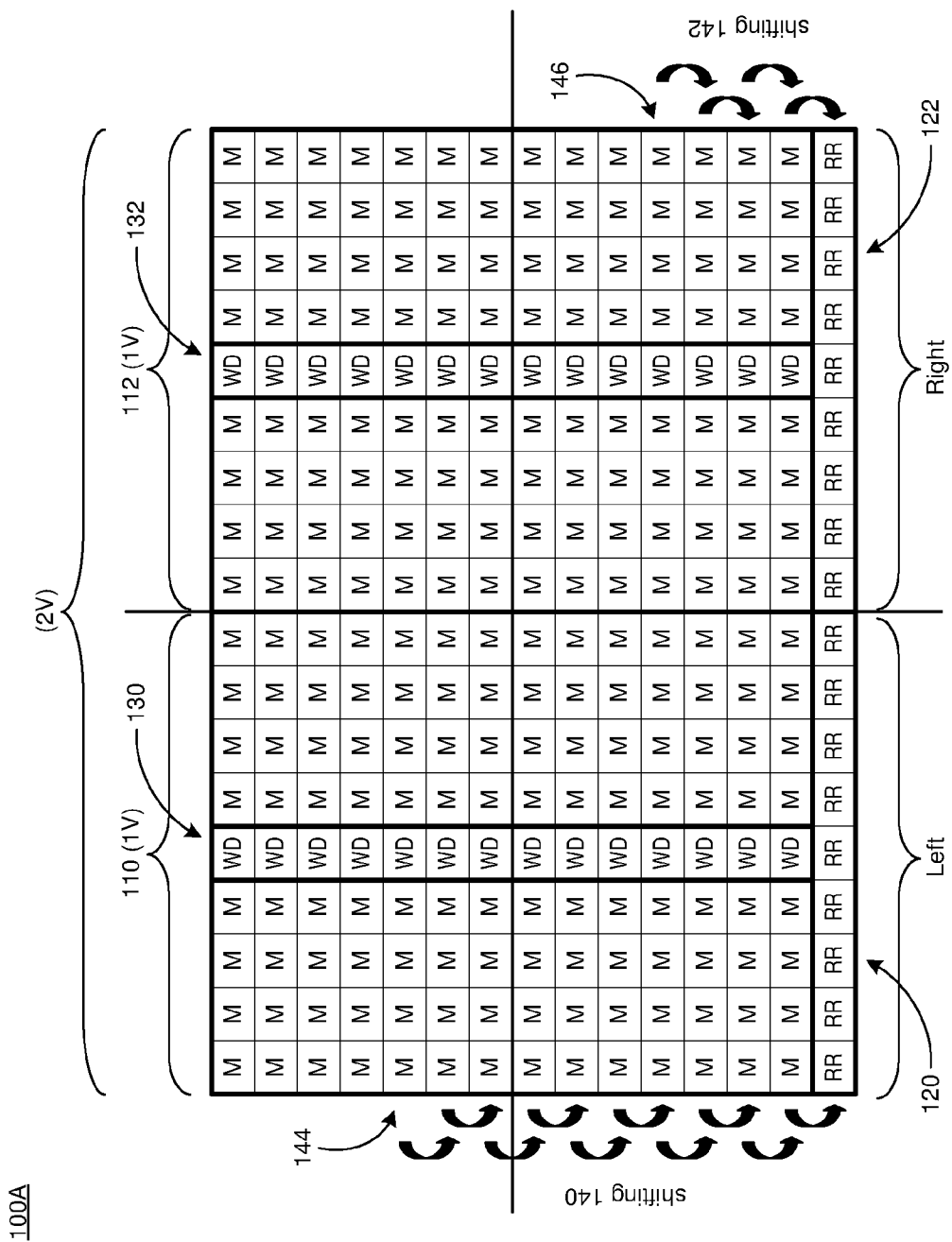
FIGS. 1A-1C illustrate various layout diagrams of memory cells in an array in accordance with various implementations described herein.
Figure 1B:
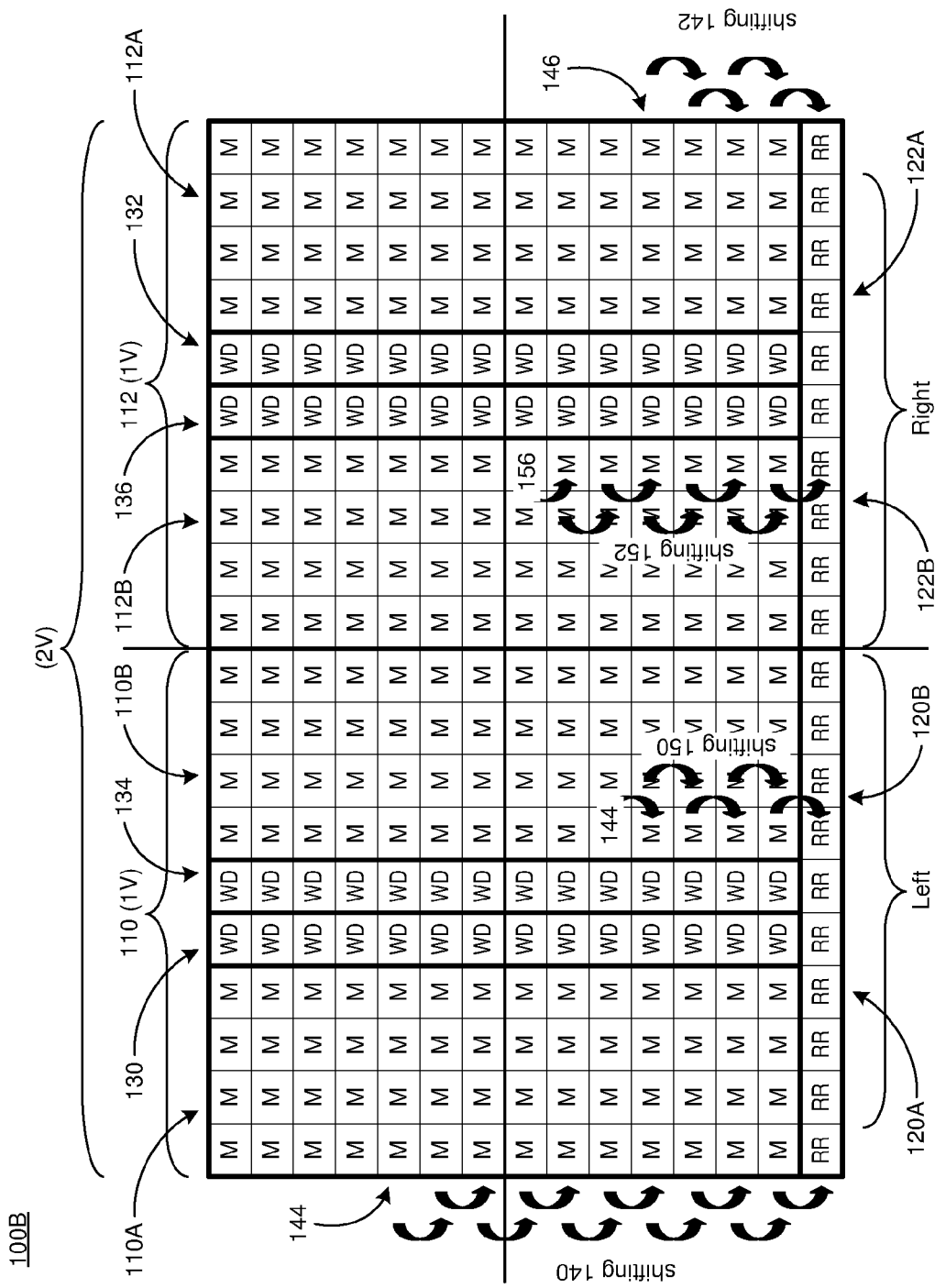
Figure 1C:
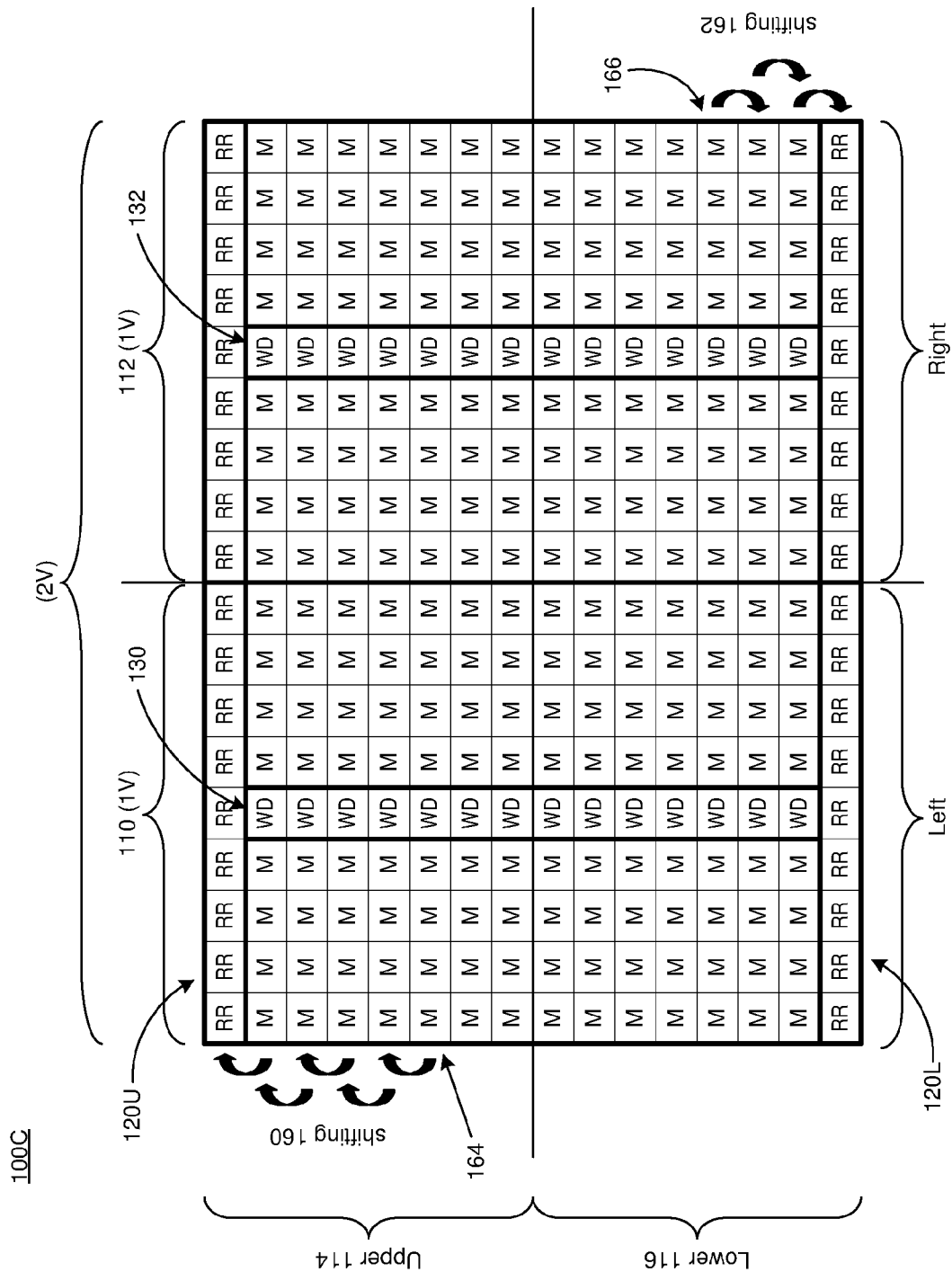

FIGS. 1A-1C illustrate various layout diagrams of memory cells in an array in accordance with implementations described herein. In particular, FIG. 1A illustrates a first layout diagram of memory cells (M) in a first multi-section array 100A with a redundant row of memory cells (RR), FIG. 1B illustrates a second layout diagram of memory cells (M) in a second multi-section array 100B with another redundant row of memory cells (RR), and FIG. 1C illustrates a third layout diagram of memory cells (M) in a third multi-section array 100C with multiple redundant rows of memory cells (RR). The memory cells (M) in the array may be implemented with memory circuitry, such as, e.g., an integrated circuit (IC) that utilizes a redundant memory scheme as described herein below.

In reference to FIG. 1A, the first multi-section array 100A may include a first array of memory cells (M) arranged in multiple columns and multiple rows. As shown, at least one of the multiple rows may be a redundant row of memory cells (RR). Further, the array 100A of memory cells (M) may be subdivided (or partitioned) into multiple sections (or regions) 110, 112 of memory cells (M) including a first section 110 of memory cells (M) having a first portion (or part) 120 of the redundant row of memory cells (RR) and a second section 112 of memory cells (M) having a second portion (or part) 122 of the redundant row of memory cells (RR). The redundant row of memory cells (RR) may be subdivided (or partitioned) into multiple portions or parts including the first portion (or part) 120 and the second portion (or part) 122 that is different than the first portion (or part) 120.

In reference to subdividing or partitioning the first array 100A, the first section 110 of memory cells (M) may be separate and operate independently from the second section 112 of memory cells (M). In some instances, the first array 100A may be referred to as a two vertical slice (2V) architecture that is subdivided or partitioned into separate one vertical slice (1V) architectures. As shown in FIG. 1A, the first section (or region) 110 of memory cells (M) may be referred to as one vertical slice (1V) architecture, and the second section (or region) 112 of memory cells (M) may be referred to as another vertical slice (1V) architecture, which are both part of the 2V architecture. As described in greater detail herein below, row repair efficiency of multiple rows may be improved with utilization of independent shifting in each 1V architecture of the 2V architecture.

The first array 100A may include wordline driver circuitry coupled to the first and second sections 110, 112 of memory cells (M) and their corresponding first and second portions 120, 122 of the redundant row of memory cells (RR). In some implementations, the first and second sections 110, 112 of memory cells (M) may refer to left (L) and right (R) sections (or regions) of memory cells (M), and the first and second portions 120, 122 of the redundant row of memory cells (RR) may refer to left (L) and right (R) portions (or parts) of the redundant row of memory cells (RR).

The wordline driver circuitry may include a first plurality of wordline drivers (WD) 130 coupled to the first section 110 of memory cells (M) and, in some cases, the first portion 120 of the redundant row of memory cells (RR). As further described herein below, the first plurality of wordline drivers (WD) 130 may include first shifting logic circuitry (e.g., in FIGS. 3A-3D) for shifting 140 a first defective row 144 of memory cells (M) from the first section 110 of memory cells (M) to the first portion 120 of the redundant row of memory cells (RR). As shown in FIG. 1A, the first plurality of wordline drivers (WD) 130 may be arranged in a first column (e.g., middle column) adjacent to the first section 110 of memory cells (M) and the first portion 120 of the redundant row of memory cells (RR). Further, each wordline driver (WD) of the first plurality of wordline drivers (WD) 130 may separately access one row of memory cells (M) in the first section 110 of memory cells (M).

The wordline driver circuitry may include a second plurality of wordline drivers 132 coupled to the second section 112 of memory cells (M) and, in some cases, the second portion 122 of the redundant row of memory cells (RR). As further described herein below, the second plurality of wordline drivers 132 may include second shifting logic circuitry (e.g., in FIGS. 3A-3D) for shifting 142 a second defective row 146 of memory cells (M) from the second section 112 of memory cells (M) to the second portion 122 of the redundant row of memory cells (RR). As further shown in FIG. 1A, the second plurality of wordline drivers (WD) 132 may be arranged in a second column (e.g., middle column) adjacent to the second section 112 of memory cells (M) and the second portion 122 of the redundant row of memory cells (RR). Further, each wordline driver (WD) of the second plurality of wordline drivers (WD) 132 may separately access one row of memory cells (M) in the second section 112 of memory cells (M).

In reference to the wordline driver circuitry, each wordline driver (WD) of the first plurality of wordline drivers (WD) 130 may be separate and operate independently from each wordline driver (WD) of the second plurality of wordline drivers (WD) 132. As described herein below in FIGS. 3A-3D, the first shifting logic circuitry may be separate and operate independently from the second shifting logic circuitry.

In reference to FIG. 1B, the second multi-section array 100B may include a second array of memory cells (M) arranged in multiple columns and multiple rows. As shown, at least one of the multiple rows may be a redundant row of memory cells (RR). Further, the array 100B of memory cells (M) may be subdivided (or partitioned) into multiple sections (or regions) 110, 112 of memory cells (M) including the first section 110 of memory cells (M) having the first portion (or part) 120 of the redundant row of memory cells (RR) and the second section 112 of memory cells (M) having a second portion (or part) 122 of the redundant row of memory cells (RR).

The second array 100B may include wordline driver circuitry coupled to the first and second sections 110, 112 of memory cells (M). As shown in FIG. 1B, the wordline driver circuitry may include the first wordline driver circuit (WD) 130 and the second wordline driver circuit (WD) 132 along with a third wordline driver circuit (WD) 134 and a fourth wordline driver circuit (WD) 136.

As shown in FIG. 1B, the first section (or region) 110 of memory cells (M) may be subdivided (or partitioned) into multiple sub-sections (or sub-regions) to include a first sub-section (or sub-region) 110A and a third sub-section (or sub-region) 110B. As such, the multiple sections (or regions) of memory cells (M) may include the first sub-section 110A of memory cells (M) corresponding to a first sub-portion (or sub-part) 120A of the redundant row of memory cells (RR) and the third sub-section 110B of memory cells (M) corresponding to a third sub-portion (or sub-part) 120B of the redundant row of memory cells (RR). Further, the first wordline driver circuit (WD) 130 may control access to each row of memory cells (M) in the first sub-section (or sub-region) 110A of memory cells (M), and the third wordline driver circuit (WD) 134 may control access to each row of memory cells (M) in the third sub-section (or sub-region) 110B of memory cells (M).

As further shown in FIG. 1B, the second section (or region) 112 of memory cells (M) may be subdivided (or partitioned) into multiple sub-sections (or sub-regions) to include a second sub-section (or sub-region) 112A and a fourth sub-section (or sub-region) 112B. As such, the multiple sections (or regions) of memory cells (M) may include the second sub-section 112A of memory cells (M) corresponding to a second sub-portion (or sub-part) 122A of the redundant row of memory cells (RR) and the fourth sub-section 112B of memory cells (M) corresponding to a fourth sub-portion (or sub-part) 122B of the redundant row of memory cells (RR). Further, the second wordline driver circuit (WD) 132 may control access to each row of memory cells (M) in the second sub-section (or sub-region) 112A of memory cells (M), and the fourth wordline driver circuit (WD) 136 may control access to each row of memory cells (M) in the fourth sub-section (or sub-region) 112B of memory cells (M).

Further, as described herein below in reference to FIGS. 3A-3D, the second array 100B may include row shift circuitry including a first row shift circuit, a second row shift circuit, a third row shift circuit, and a fourth row shift circuit. The row shift circuitry may be coupled to the first and second sections (or regions) regions 110, 112 of memory cells (M) and their corresponding first and second portions (or parts) 120, 122 of the redundant row of memory cells (RR).

The first row shift circuit may be coupled to the first sub-section (or sub-region) 110A of memory cells (M) and its corresponding first sub-portion (or sub-part) 120A of the redundant row of memory cells (RR). The first row shift circuit may control shifting 140 of at least one row 144 of memory cells (M) from the first sub-section (or sub-region) 110A of memory cells (M) to the first sub-portion (or sub-part) 120A of the redundant row of memory cells (RR).

The second row shift circuit may be coupled to the second sub-section (or sub-region) 112A of memory cells (M) and its corresponding second sub-portion (or sub-part) 122A of the redundant row of memory cells (RR). The second row shift circuit may control shifting 142 of at least one row 146 of memory cells (M) from the second sub-section (or sub-region) 112A of memory cells (M) to the second sub-portion (or sub-part) 122A of the redundant row of memory cells (RR).

The third row shift circuit may be coupled to the third sub-section (or sub-region) 1106 of memory cells (M) and its corresponding third sub-portion (or sub-part) 120B of the redundant row of memory cells (RR). The third row shift circuit may control shifting 150 of at least one row 154 of memory cells (M) from the third sub-section (or sub-region) 1106 of memory cells (M) to the third sub-portion (or sub-part) 120B of the redundant row of memory cells (RR).

The fourth row shift circuit may be coupled to the fourth sub-section (or sub-region) 112B of memory cells (M) and its corresponding fourth sub-portion (or sub-part) 122B of the redundant row of memory cells (RR). The fourth row shift circuit may control shifting 152 of at least one row 156 of memory cells (M) from the fourth sub-section (or sub-region) 1126 of memory cells (M) to the fourth sub-portion (or sub-part) 122B of the redundant row of memory cells (RR).

As shown above, the redundant row of memory cells (RR) may be subdivided (or partitioned) into multiple sub-portions or sub-parts including the first sub-portion (or sub-part)

120A, the second sub-portion (or sub-part) 122A, the third sub-portion (or sub-part) 120B, and the fourth sub-portion (or sub-part) 122B. Further, each of the sub-portions (or sub-parts) 120A, 120B, 122A, 122B are different, separate, and operate independently than each other of the sub-portions (or sub-parts) 120A, 120B, 122A, 122B. As described in herein below, row repair efficiency of multiple rows may be improved with utilization of independent shifting in each half of the 1V architecture of the 2V architecture.

In reference to FIG. 1C, the third multi-section array 100C may include a third array of memory cells (M) arranged in multiple columns and multiple rows. As shown, the array 100C of memory cells (M) may be subdivided (or partitioned) into multiple sections (or regions) 110, 112 of memory cells (M) including the first section 110 of memory cells (M) and the second section 112 of memory cells (M).

The first and second sections (or regions) of memory cells (M) may refer to upper and lower sections (or regions) 114, 116 of memory cells (M). As shown in FIG. 1C, the third multi-section array 100C may include multiple redundant rows of memory cells (RR) including, e.g., an upper redundant row 120U of memory cells (RR) corresponding to the upper section 114 of memory cells (M) and a lower redundant row 120L of memory cells (RR) corresponding to the lower section 116 of memory cells (M). As described in FIGS. 3A-3D, the upper section 114 of memory cells (M) may include first shifting logic for shifting 160 a first defective row 164 of memory cells (M) from the upper section 114 of memory cells (M) to the upper redundant row 120U of memory cells (RR), and the lower section 116 of memory cells (M) may include second shifting logic for shifting 162 a second defective row 166 of memory cells (M) from the lower section 116 of memory cells (M) to the lower redundant row 120L of memory cells (RR).

Therefore, as shown in FIG. 1C, the multiple redundant rows 120U, 120L of memory cells (RR) may be used in corresponding upper and lower sections (or regions) 114, 116 of memory cells (M). Further, the upper section (or region) 114 of memory cells (M) is different, separate, and operate independently than the lower section (or region) 116 of memory cells (M). As described in herein below, row repair efficiency of multiple rows may be improved with utilization of independent shifting in upper and lower halves of the 1V architecture of the 2V architecture.

The memory cells (M) may be referred to as a bitcell, and each memory cell (M) may be configured to store at least one data bit value (e.g., related to logic 0 or 1). In some cases, the memory cells (M) may be implemented with various types of memory circuitry, such e.g., SRAM circuitry. Thus, in some cases, each memory cell (M) may include a semiconductor based multi-transistor SRAM cell, including various types of SRAM cells, such as, e.g., 6T CMOS SRAM and/or other types of CMOS SRAM cells, such as, e.g., 4T, 8T, 10T, or more transistors per bit. Further, the memory cells (M) as described herein may not be limited to volatile type memory applications, such as, e.g., SRAM, etc., but may be utilized in various non-volatile type memory applications, such as, e.g., DRAM, ROM, etc.

The redundant memory cells may be referred to as a bitcell, and each redundant memory cell may be configured to store at least one data bit value (e.g., related to logic 0 or 1). In certain situations, the redundant memory cells may be implemented with flip-flop circuitry, latch circuitry, or some other type of logic or memory type storage device circuitry. Thus, each redundant memory cell may include some type of logic device (e.g., flip-flop, latch, or similar) that is capable of storing at least one data bit value. Each redundant memory cell may include a multi-transistor SRAM cell, including various types of SRAM cells, such as, e.g., 6T CMOS SRAM and/or other types of CMOS SRAM cells, such as, e.g., 4T, 8T, 10T or more transistors per bit. The memory circuitry as described herein is not limited to volatile type memory applications, such as, e.g., flip-flop, latch, SRAM, etc., but may be utilized in various non-volatile type memory applications, such as, e.g., DRAM, ROM, etc.

Figure 2A:
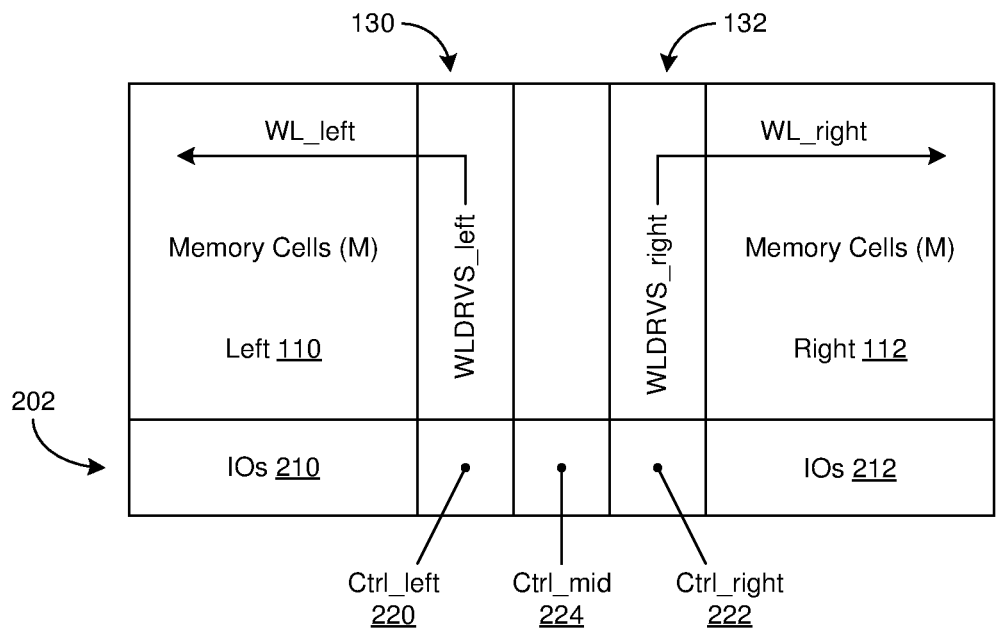
FIGS. 2A-2B illustrate diagrams of wordline driver circuitry in accordance with various implementations described herein.
Figure 2B:
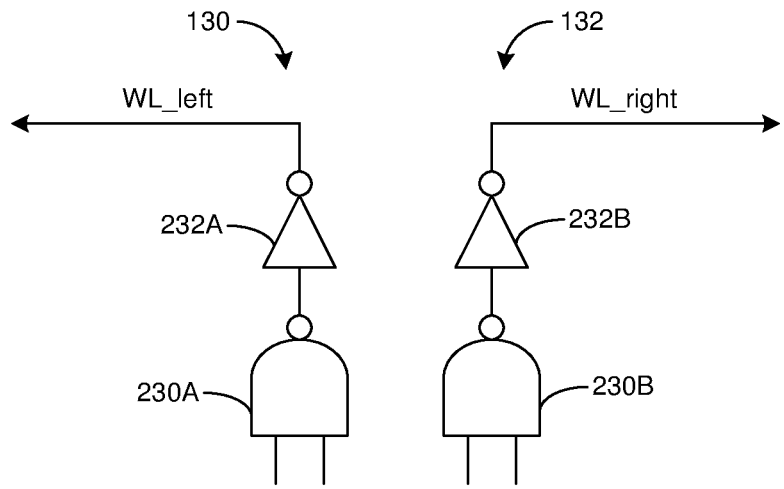

FIGS. 2A-2B illustrate diagrams of wordline driver circuitry in accordance with various implementations described herein. In particular, FIG. 2A illustrates a first diagram 200A of the array of memory cells (M) subdivided (or partitioned) in the left and right sections (or regions) 110, 112 of memory cells (M) with corresponding left and right wordline drivers 130, 132, e.g., as described in reference to FIG. 1A. Further, FIG. 2B illustrates a second diagram of logic devices 230A, 230B, 232A, 232B that may be utilized to implement the left and right wordline drivers 130, 132 of FIG. 2A.

As shown in FIG. 2A, the left section (or region) 110 of memory cells (M) has the corresponding left wordline driver circuitry 130, which includes a plurality of left-side wordline drivers (WLDRVS_left) that may be arranged in the first column adjacent to the left section (or region) 110 of memory cells (M). In some cases, each left wordline driver (WLDRVS_left) may separately access one row of memory cells (M) in the left section (or region) 110 of memory cells (M) via a left-side wordline (WL_left). Further, as shown in FIG. 2A, the right section (or region) 112 of memory cells (M) has the corresponding right wordline driver circuitry 132, which includes a plurality of right-side wordline drivers (WLDRVS_right) that may be arranged in the second column adjacent to the right section (or region) 112 of memory cells (M). In some cases, each right wordline driver (WLDRVS_right) may separately access one row of memory cells (M) in the right section (or region) 112 of memory cells (M) via a right-side wordline (WL_right).

The array of memory cells (M) may include control logic circuitry 202 including left-side input/output (I/O) control logic 210 (e.g., left-side bitline driver circuitry) that is configured to interface with the left wordline driver circuitry 130 and some other left-side control logic (Crtl_left) 220. Further, the control logic circuitry 202 may include right-side input/output (I/O) control logic 212 (e.g., right-side bitline driver circuitry) that is configured to interface with the right wordline driver circuitry 132 and some other right-side control logic (Crtl_right) 222. The control logic circuitry 202 may further include middle (or center) control logic 224 that may be configured to interface with the left-side I/O control logic 210, 220 and/or the right-side I/O control logic 212, 222.

As shown in FIG. 2B, multiple logic devices 230A, 230B, 232A, 232B may be used to implement the left and right wordline drivers 130, 132 of FIG. 2A. For instance, the multiple logic devices 230A, 230B, 232A, 232B may be arranged with a butterfly architecture, wherein the left and right sides of the array of memory cells (M) may use separate wordline drivers (WLDRVS). In this instance, each left-side wordline driver (WLDRVS_left) may be implemented with multiple logic devices that include a first logic device 230A, such as, e.g., a first NAND gate, coupled in series with a second logic device 232A, such as, e.g., a first inverter. As shown, an output of the second logic device 232A may provide an access signal for the left-side wordline (WL_left).

Further, in this instance, each right-side wordline driver (WLDRVS_right) may be implemented with multiple logic devices that include a third logic device 230B, such as, e.g., a second NAND gate, coupled in series with a fourth logic device 232B, such as, e.g., a second inverter. As shown, an output of the fourth logic device 232B may provide an access signal for the right-side wordline (WL_right).

Figure 3A:
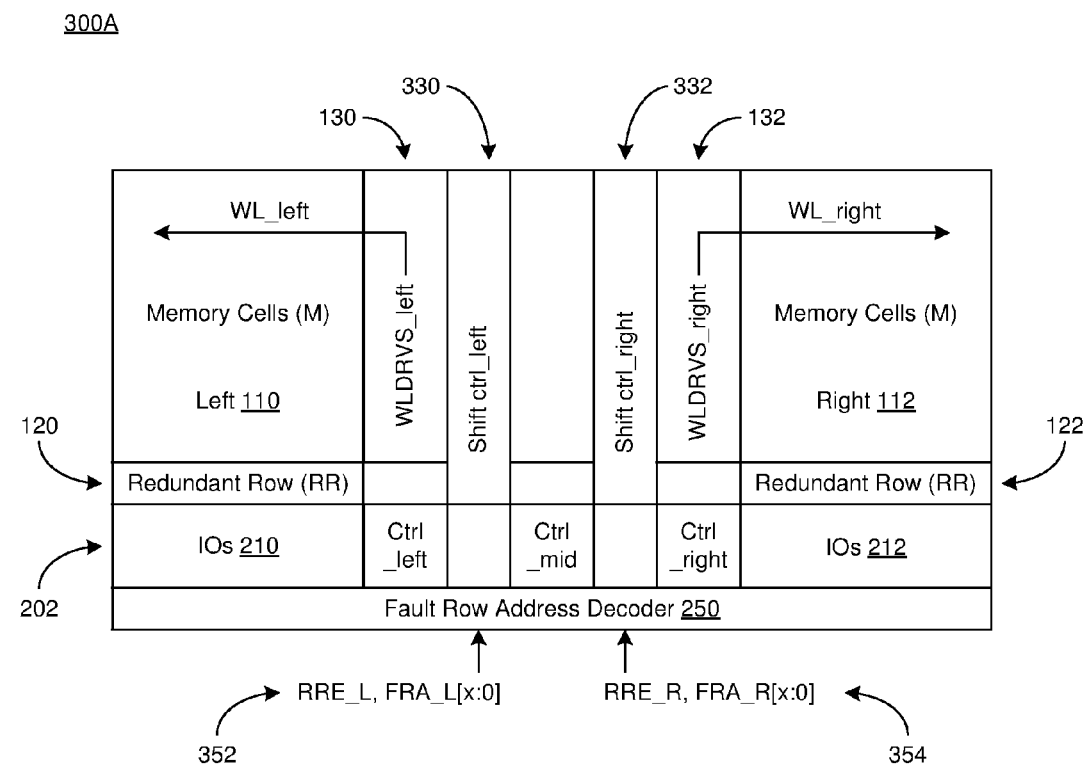
FIGS. 3A-3D illustrate various diagrams of row shift circuitry in accordance with various implementations described herein.
Figure 3B:
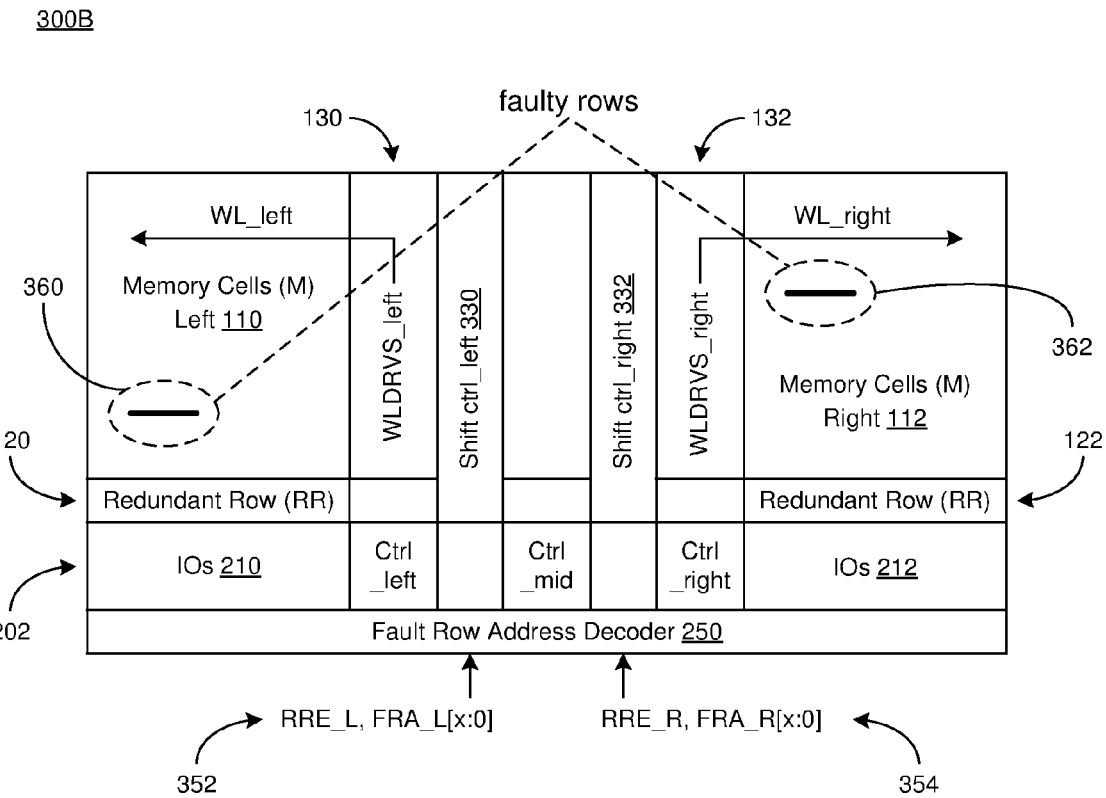
Figure 3C:
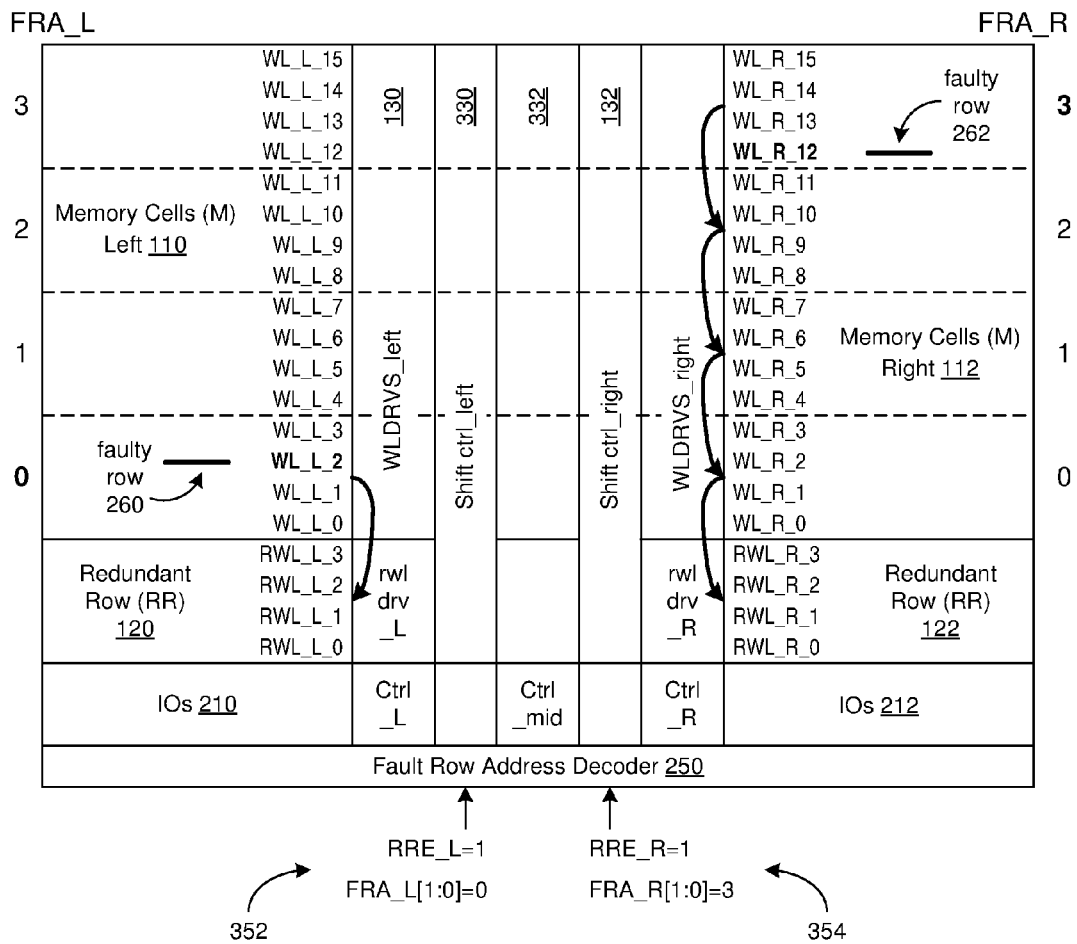
Figure 3D:
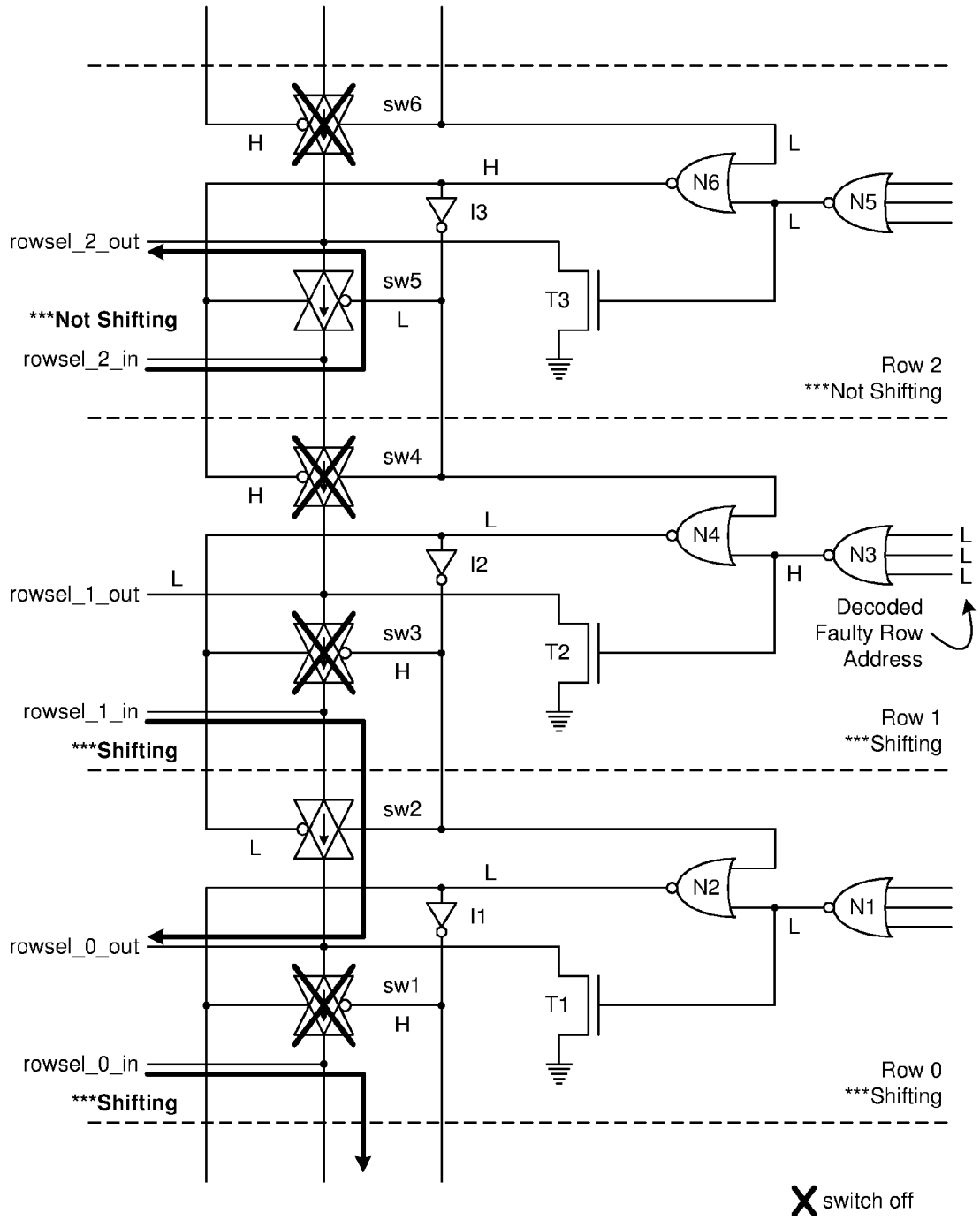

FIGS. 3A-3D illustrate various diagrams of row shift circuitry in accordance with various implementations described herein. In particular, FIG. 3A illustrates a first diagram 300A of the array of memory cells (M) subdivided (or partitioned) in the left and right sections (or regions) 110, 112 of memory cells (M) with corresponding left and right row shift circuitry 230, 232. FIG. 3B illustrates a second diagram 300B of separate defective or faulty rows in the left and right sections (or regions) 110, 112 of memory cells (M) corresponding to the left and right row shift circuitry 230, 232. FIG. 3C illustrates a third diagram 300C of separate shifting of the separate defective or faulty rows with the left and right row shift circuitry 230, 232. FIG. 3D illustrates a fourth diagram 300D of shifting control logic corresponding to the left and right row shift circuitry 230, 232.

As shown in FIG. 3A, the left section (or region) 110 of memory cells (M) has the corresponding left wordline driver circuitry 130, which includes the left-side wordline drivers (WLDRVS_left) arranged in the first column adjacent to the left section (or region) 110 of memory cells (M) and the left portion (or part) 120 of the redundant row of memory cells (RR). Further, as shown in FIG. 3A, the right section (or region) 112 of memory cells (M) has the corresponding right wordline driver circuitry 132, which includes the right-side wordline drivers (WLDRVS_right) arranged in the second column adjacent to the right section (or region) 112 of memory cells (M) and the right portion (or part) 122 of the redundant row of memory cells (RR).

The array of memory cells (M) may include multiple row shift circuitry 330, 332 for implementing shift based row redundancy. For instance, the row shift circuitry may include left-side row shift circuitry 330 having first shifting logic for shifting a first defective row of memory cells (M) from the left section (or region) 110 of memory cells (M) to the left portion (or part) 120 of the redundant row of memory cells (RR). Further, the row shift circuitry may include right-side row shift circuitry 332 having second shifting logic for shifting a first defective row of memory cells (M) from the right section (or region) 112 of memory cells (M) to the right portion (or part) 122 of the redundant row of memory cells (RR). As described herein, the first shifting logic is different, separate, and operates independently from the second shifting logic.

Further, the array of memory cells (M) may include a fault row address decoder 250 for further implementing shift based row redundancy with separate left and right redundant shifting control. For instance, multiple defective or faulty rows may be repaired, such as, e.g., two different faults on different rows in separate left and right sides may be repaired using the row redundancy schemes as described herein. As shown in FIG. 3B, a first defect or fault 360 in the left section (or region) 110 of memory cells (M) may be repaired by using left-side row redundancy addressing, such as, e.g., RRE_L, FRA_L[x:0], and further, a second defect or fault 362 in the right section (or region) 112 of memory cells (M) may be repaired by using right-side row redundancy addressing, such as, e.g., RRE_R, FRA_R[x:0]. In these instances of addressing faults, RRE refers to Row Redundancy Enable, and FRA refers to Faulty Row Address.

FIG. 3C illustrates diagram 300C of an operation implementation of shift based row redundancy with separate left and right redundant shifting control.

For instance, as shown in FIG. 3C, if there are two (2) row faults on different rows in left and right sides (e.g., WL_L_2 and WL_R_12), the left and right faulty row addresses may be FRA_L[1:0]=0 and FRA_R[1:0]=3. In this instance, for repair of a left-side faulty row, if an input of RRE_L=1 for the faulty row address (FRA), then faulty row WL_L_0,1,2,3 may be moved (or shifted) to redundant row RWL_L_0,1,2,3, as shown in FIG. 3C. For repair of a right-side faulty row, if an input of RRE_R=1 for the faulty row address (FRA), then faulty row WL_R_12,13,14,15 may be moved (or shifted) to row WL_R_8,9,10,11, and row WL_R_8,9,10,11 may be moved (or shifted) to row WL_R_4,5,6,7, and row WL_R_4,5,6,7may be moved (or shifted) to row WL_R_0,1,2,3, and then row WL_R_0,1,2,3 may be moved to redundant row RWL_R_0,1,2,3. During operation, the redundant memory cell or bitcell RWL_L_2 may be enabled instead of the faulty memory cell or bitcell WL_L_2, and the redundant memory cell or bitcell WL_R_8 may be enabled instead of the faulty memory cell or bitcell (WL_R_12).

FIG. 3D illustrates diagram 300D of one operational implementation of shifting control logic for shift based row redundancy shifting control. As shown in FIG. 3D, the row shifting logic for each row (e.g., first, second, third, and fourth rows) may include multiple logic components including, e.g., multiple switches, inverters, transistors, and gates that are arranged to receive a row select input signal as input to each row and provide a row select output signal as output from each row. FIG. 3D illustrates one row redundancy scheme of a row shifting method that may be utilized to implement shifting control logic for shift based row redundancy shifting control. It should be appreciated by those skilled in the art that there are other ways, means, and/or techniques to implement row redundancy schemes as provided and described herein.

For instance, the first row (e.g., row 0) may include a first switch sw1, a second switch sw2, a first inverter I1, a first transistor T1, a first NAND gate N1, and a second NAND gate N2 that are arranged to receive a first row select input signal (rowsel_0_in) and provide a first row select output signal (rowsel_0_out). The second row (e.g., row 1) may include a third switch sw3, a fourth switch sw4, a second inverter I2, a second transistor T2, a third NAND gate N3, and a fourth NAND gate N4 that are arranged to receive a second row select input signal (rowsel_1_in) and provide a second row select output signal (rowsel_1_out). The third row (e.g., row 2) may include a fifth switch sw5, a sixth switch sw6, a third inverter I3, a third transistor T3, a fifth NAND gate N5, and a sixth NAND gate N6 that are arranged to receive a third row select input signal (rowsel_2_in) and provide a third row select output signal (rowsel_2_out). Further, each additional row may include similar row shifting logic as rows 0, 1, 2 that is arranged to receive an additional row select input signal and provide an additional row select output signal.

During operation, as shown in FIG. 3D, the fifth switch sw5 is on, the sixth switch sw6 is off, and the third row (e.g., row 2) is not enabled for shifting. Further, the third switch sw3 is off, the fourth switch sw4 is off, and the second row (e.g., row 1) is enabled for shifting. Further, the first switch sw1 is off, the second switch sw2 is on, and the first row (e.g., row 0) is enabled for shifting.

Figure 4:
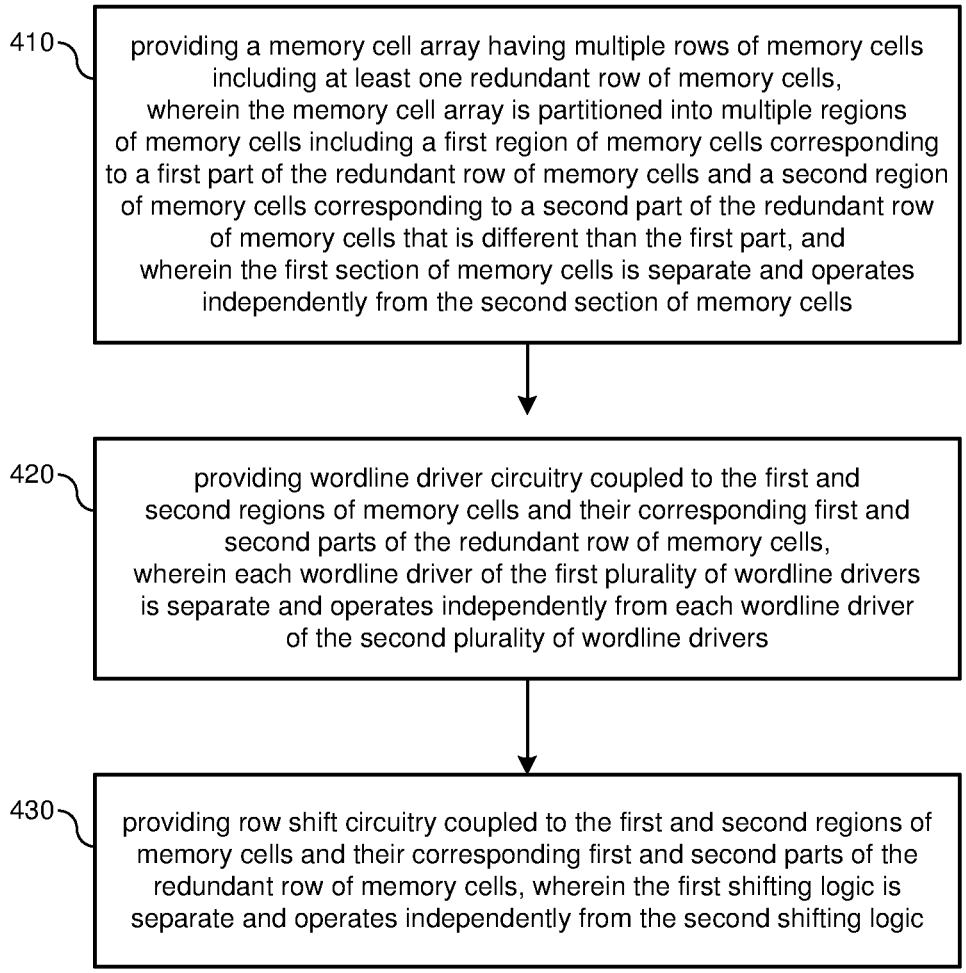
FIG. 4 illustrates a process flow of a method of fabricating an integrated circuit in accordance with various implementations described herein.

FIG. 4 illustrates a process flow of a method 400 for providing row redundancy schemes for memory applications in accordance with various implementations described herein. It should be understood that even though method 400 may indicate a particular order of operation execution, in some instances, various certain portions of the operations may be executed in a different order, and on different systems. In some other instances, additional operations or steps may be added to and/or omitted from method 400. Further, the method 400 may be implemented in hardware and/or software. If implemented in hardware, the method 400 may be implemented with various circuit components, such as described herein above in reference to FIGS. 1A-3D. If implemented in software, the method 400 may be implemented as a program or software instruction process that may be configured to provide row redundancy as described herein. Further, if implemented in software, instructions related to implementing the method 400 may be stored in memory and/or a database. For instance, a computer or various other computing devices having a processor and memory may be configured to perform method 400.

In reference to FIG. 4, method 400 may provide for fabricating an integrated circuit having a row redundancy scheme for memory applications.

At block 410, method 400 may provide a memory cell array having multiple rows of memory cells including at least one redundant row of memory cells. The memory cell array may be partitioned into multiple regions of memory cells including a first region of memory cells corresponding to a first part of the redundant row of memory cells and a second region of memory cells corresponding to a second part of the redundant row of memory cells that is different than the first part. The first section of memory cells may be separate and operate independently from the second section of memory cells.

At block 420, method 400 may provide wordline driver circuitry coupled to the first and second regions of memory cells and their corresponding first and second parts of the redundant row of memory cells. The wordline driver circuitry may include a first wordline driver circuit that controls access to each row of memory cells in the first region of memory cells. The wordline driver circuitry may include a second wordline driver circuit that controls access to each row of memory cells in the second region of memory cells. The first and second wordline driver circuits may be separate and operate independently from each other.

At block 430, method 400 may provide row shift circuitry coupled to the first and second regions of memory cells and their corresponding first and second parts of the redundant row of memory cells. The first shifting logic may be separate and operate independently from the second shifting logic.

The wordline driver circuitry may include a first plurality of wordline drivers coupled to the first region of memory cells and the first part of the redundant row of memory cells. Further, the row shift circuitry may include first shifting logic for shifting a first defective row of memory cells from the first region of memory cells to the first part of the redundant row of memory cells.

The wordline driver circuitry may include a second plurality of wordline drivers coupled to the second region of memory cells and the second part of the redundant row of memory cells. Further, the row shift circuitry may include second shifting logic for shifting a second defective row of memory cells from the second region of memory cells to the second part of the redundant row of memory cells.

Described herein are various implementations of an integrated circuit. The integrated circuit may include an array of memory cells arranged in multiple columns and multiple rows, wherein at least one of the multiple rows may include a redundant row of memory cells. The array of memory cells may be subdivided into multiple sections of memory cells including a first section of memory cells having a first portion of the redundant row of memory cells and a second section of memory cells having a second portion of the redundant row of memory cells. A first plurality of wordline drivers may be coupled to the first section of memory cells and the first portion of the redundant row of memory cells. The first plurality of wordline drivers may have first shifting logic for shifting a first defective row of memory cells from the first section of memory cells to the first portion of the redundant row of memory cells. A second plurality of wordline drivers may be coupled to the second section of memory cells and the second portion of the redundant row of memory cells. The second plurality of wordline drivers may have second shifting logic for shifting a second defective row of memory cells from the second section of memory cells to the second portion of the redundant row of memory cells.

Described herein are various implementations of an integrated circuit. The integrated circuit may include a memory cell array having multiple rows of memory cells including at least one redundant row of memory cells. The memory cell array may be partitioned into multiple regions of memory cells including a first region of memory cells corresponding to a first part of the redundant row of memory cells and a second region of memory cells corresponding to a second part of the redundant row of memory cells that is different than the first part. The integrated circuit may include wordline driver circuitry coupled to the first and second regions of memory cells and their corresponding first and second parts of the redundant row of memory cells. The integrated circuit may include row shift circuitry coupled to the first and second regions of memory cells and their corresponding first and second parts of the redundant row of memory cells.

Described herein are various implementations of a method of fabricating an integrated circuit. The method may include providing a memory cell array having multiple rows of memory cells including at least one redundant row of memory cells. The memory cell array may be partitioned into multiple regions of memory cells including a first region of memory cells corresponding to a first part of the redundant row of memory cells and a second region of memory cells corresponding to a second part of the redundant row of memory cells that is different than the first part. The first section of memory cells may be separate and may operate independently from the second section of memory cells. The method may include providing wordline driver circuitry coupled to the first and second regions of memory cells and their corresponding first and second parts of the redundant row of memory cells. Each wordline driver of the first plurality of wordline drivers may be separate and may operate independently from each wordline driver of the second plurality of wordline drivers. The method may include providing row shift circuitry coupled to the first and second regions of memory cells and their corresponding first and second parts of the redundant row of memory cells. The first shifting logic may be separate and may operate independently from the second shifting logic.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    an array of memory cells arranged in multiple columns and multiple rows,
    wherein at least one of the multiple rows comprises a redundant row of memory cells, and
    wherein the array of memory cells is subdivided into multiple sections of memory cells including a first section of memory cells having a first portion of the redundant row of memory cells and a second section of memory cells having a second portion of the redundant row of memory cells,
    a first plurality of wordline drivers coupled to the first section of memory cells and the first portion of the redundant row of memory cells, wherein the first plurality of wordline drivers has first shifting logic for shifting a first defective row of memory cells from the first section of memory cells to the first portion of the redundant row of memory cells; and
    a second plurality of wordline drivers coupled to the second section of memory cells and the second portion of the redundant row of memory cells, wherein the second plurality of wordline drivers has second shifting logic for shifting a second defective row of memory cells from the second section of memory cells to the second portion of the redundant row of memory cells.

2. The integrated circuit of claim 1, wherein the first section of memory cells is separate and operates independently from the second section of memory cells.

3. The integrated circuit of claim 1, wherein each wordline driver of the first plurality of wordline drivers is separate and operates independently from each wordline driver of the second plurality of wordline drivers.

4. The integrated circuit of claim 1, wherein the first shifting logic is separate and operates independently from the second shifting logic.

5. The integrated circuit of claim 1, wherein the first plurality of wordline drivers is arranged in a first column adjacent to the first section of memory cells and the first portion of the redundant row of memory cells, and wherein each wordline driver of the first plurality of wordline drivers separately accesses one row of memory cells in the first section of memory cells.

6. The integrated circuit of claim 1, wherein the second plurality of wordline drivers is arranged in a second column adjacent to the second section of memory cells and the second portion of the redundant row of memory cells, and wherein each wordline driver of the second plurality of wordline drivers separately accesses one row of memory cells in the second section of memory cells.

7. The integrated circuit of claim 1, wherein the first and second sections of memory cells comprise left and right sections of memory cells, and wherein the first and second portions of the redundant row of memory cells comprise left and right portions of the redundant row of memory cells.

8. The integrated circuit of claim 1, wherein the first and second sections of memory cells comprise upper and lower sections of memory cells.

9. The integrated circuit of claim 8, wherein:
    the redundant row of memory cells comprises an upper redundant row of memory cells corresponding to the upper section of memory cells, and at least one other of the multiple rows comprises a lower redundant row of memory cells corresponding to the lower section of memory cells.

10. The integrated circuit of claim 9, wherein:
the first shifting logic shifts the first defective row of memory cells from the upper section of memory cells to the upper redundant row of memory cells, and
the second shifting logic shifts the second defective row of memory cells from the lower section of memory cells to the lower redundant row of memory cells.

11. An integrated circuit, comprising:
a memory cell array having multiple rows of memory cells including at least one redundant row of memory cells,
wherein the memory cell array is partitioned into multiple regions of memory cells including a first region of memory cells corresponding to a first part of the redundant row of memory cells and a second region of memory cells corresponding to a second part of the redundant row of memory cells that is different than the first part;
wordline driver circuitry coupled to the first and second regions of memory cells and their corresponding first and second parts of the redundant row of memory cells; and
row shift circuitry coupled to the first and second regions of memory cells and their corresponding first and second parts of the redundant row of memory cells.

12. The integrated circuit of claim 11, wherein:
the wordline driver circuitry comprises a first wordline driver circuit that controls access to each row of memory cells in the first region of memory cells, and
the row shift circuitry comprises a first row shift circuit that controls shifting of at least one row of memory cells from the first region of memory cells to the first part of the redundant row of memory cells.

13. The integrated circuit of claim 12, wherein:
the wordline driver circuitry comprises a second wordline driver circuit that controls access to each row of memory cells in the second region of memory cells, and
the row shift circuitry comprises a second row shift circuit that controls shifting of at least one row of memory cells from the second region of memory cells to the second part of the redundant row of memory cells.

14. The integrated circuit of claim 11, wherein:
the multiple regions of memory cells include a third region of memory cells corresponding to a third part of the redundant row of memory cells,
the wordline driver circuitry is coupled to the third region of memory cells and its corresponding third part of the redundant row of memory cells, and
the row shift circuitry is coupled to the third region of memory cells and its corresponding third part of the redundant row of memory cells.

15. The integrated circuit of claim 14, wherein:
the wordline driver circuitry comprises a third wordline driver circuit that controls access to each row of memory cells in the third region of memory cells, and
the row shift circuitry comprises a third row shift circuit that controls shifting of at least one row of memory cells from the third region of memory cells to the third part of the redundant row of memory cells.

16. The integrated circuit of claim 11, wherein:
the multiple regions of memory cells include a fourth region of memory cells corresponding to a fourth part of the redundant row of memory cells,
the wordline driver circuitry is coupled to the fourth region of memory cells and its corresponding fourth part of the redundant row of memory cells, and
the row shift circuitry is coupled to the fourth region of memory cells and its corresponding fourth part of the redundant row of memory cells.

17. The integrated circuit of claim 16, wherein:
the wordline driver circuitry comprises a fourth wordline driver circuit that controls access to each row of memory cells in the fourth region of memory cells, and
the row shift circuitry comprises a fourth row shift circuit that controls shifting of at least one row of memory cells from the fourth region of memory cells to the fourth part of the redundant row of memory cells.

18. A method of fabricating an integrated circuit, the method comprising:
providing a memory cell array having multiple rows of memory cells including at least one redundant row of memory cells, wherein the memory cell array is partitioned into multiple regions of memory cells including a first region of memory cells corresponding to a first part of the redundant row of memory cells and a second region of memory cells corresponding to a second part of the redundant row of memory cells that is different than the first part, and wherein the first section of memory cells is separate and operates independently from the second section of memory cells;
providing wordline driver circuitry coupled to the first and second regions of memory cells and their corresponding first and second parts of the redundant row of memory cells, wherein each wordline driver of the first plurality of wordline drivers is separate and operates independently from each wordline driver of the second plurality of wordline drivers; and
providing row shift circuitry coupled to the first and second regions of memory cells and their corresponding first and second parts of the redundant row of memory cells, wherein the first shifting logic is separate and operates independently from the second shifting logic.

19. The method of claim 18, wherein:
the wordline driver circuitry includes a first plurality of wordline drivers coupled to the first region of memory cells and the first part of the redundant row of memory cells, and
the row shift circuitry includes first shifting logic for shifting a first defective row of memory cells from the first region of memory cells to the first part of the redundant row of memory cells.

20. The method of claim 18, wherein:
the wordline driver circuitry includes a second plurality of wordline drivers coupled to the second region of memory cells and the second part of the redundant row of memory cells, and
the row shift circuitry includes second shifting logic for shifting a second defective row of memory cells from the second region of memory cells to the second part of the redundant row of memory cells.

* * * * *